(12) United States Patent
Shimizu et al.

(10) Patent No.: US 6,375,868 B1
(45) Date of Patent: Apr. 23, 2002

(54) METHOD FOR MANUFACTURING PASTE FOR ELECTROCONDUCTIVE THICK FILM, PASTE FOR ELECTROCONDUCTIVE THICK FILM AND LAMINATED CERAMIC ELECTRONIC PART

(75) Inventors: Motohiro Shimizu, Kusatsu; Atsuyoshi Maeda, Otsu; Hisashi Miki, Kyoto, all of (JP)

(73) Assignee: Murata Manufacturing Co., Ltd. (JP)

( * ) Notice: Subject to any disclaimer, the term of this patent is extended or adjusted under 35 U.S.C. 154(b) by 10 days.

(21) Appl. No.: 09/598,013

(22) Filed: Jun. 20, 2000

(30) Foreign Application Priority Data

Jun. 25, 1999 (JP) .............................. 11-180449
Apr. 19, 2000 (JP) ........................ 2000-118260

(51) Int. Cl.⁷ ............................ H01B 1/22; H05K 1/00; C09D 5/24
(52) U.S. Cl. ...................... 252/512; 252/514; 106/311; 106/499
(58) Field of Search ................................. 252/512, 514; 106/311, 499

(56) References Cited

U.S. PATENT DOCUMENTS 5,372,750 A * 12/1994 Thoma ....................... 252/512
5,781,402 A    7/1998 Fujiyama et al.
5,840,216 A   11/1998 Ohtani et al.
5,928,569 A *  7/1999 Reo ............................ 252/514
6,207,081 B1 * 3/2001 Sasaki et al. ................ 252/512

OTHER PUBLICATIONS

WPI Accession No. 1994–154476 [19] and JP 6096998 A (Taiyo). See Abstract.

* cited by examiner

*Primary Examiner*—Mark Kopec
(74) *Attorney, Agent, or Firm*—Ostrolenk, Faber, Gerb & Soffen, LLP

(57) ABSTRACT

There is disclosed a method for manufacturing a paste for electroconductive thick film using a solid component, a diluting solvent, a dispersant, an organic resin component, and a main solvent, wherein the boiling point of the diluting solvent is lower than that of the main solvent by about 100° C. or more, and the diluting solvent is compatible with the organic resin component and the main solvent, the method comprising a first dispersion step for obtaining a first slurry by subjecting to a dispersion treatment, a first mill base prepared through mixing the solid component, the diluting solvent and the dispersant, a second dispersion step for obtaining a second slurry by subjecting to a dispersion treatment, a second mill base prepared through mixing the first slurry with the organic resin component and the main solvent, and a step for removing the diluting solvent from the second slurry.

16 Claims, 4 Drawing Sheets

METHOD FOR MANUFACTURING PASTE FOR ELECTROCONDUCTIVE THICK FILM, PASTE FOR ELECTROCONDUCTIVE THICK FILM AND LAMINATED CERAMIC ELECTRONIC PART

BACKGROUND OF THE INVENTION

1. Field of the Invention

The present invention relates to a method for manufacturing a paste for electroconductive thick film. More specifically, the present invention relates to a method for manufacturing a paste for electroconductive thick film used for an internal electrode of a laminated ceramic electronic part, a paste for electroconductive thick film obtained by a method according to the present invention, and a laminated ceramic electronic part using it.

2. Description of the Related Art

A paste for electroconductive thick film, such as a paste for electroconductive thick film for screen printing for use in a laminated ceramic electronic part, is usually prepared by kneading an electroconductive component comprising a metallic powder such as Ni, Cu, Ag or Pd with an organic vehicle prepared by dissolving an organic resin component such as ethyl cellulose or an acrylic resin into a relatively high-boiling point main solvent such as carbitol or terpineol, followed by dispersion using a dispersion machine. The paste for electroconductive thick film for use in screen printing should be adjusted to have a viscosity of 10 Pa.s or more to attain a high printing precision. Three rolls are generally employed as a means for dispersing such a highly viscous paste.

When a metallic powder included in the solid component is a fine powder having an average primary particle size of 1.0 μm or less in the above described method for manufacturing a paste for electroconductive thick film, the aggregation power between powder particles is increased due to the increased specific surface area of the solid component powder, so that dispersion with three rolls or the like cannot achieve full disintegration of the aggregated solid component powder, thus resulting in the problem of undispersed solid component aggregate remaining in the paste for electroconductive thick film.

There is a method in which a dispersant additive is added to a mill base before the dispersion treatment in order to achieve a solid component containing a powder having an average primary particle size of 1.0 μm or less dispersed uniformly in a paste. However, in the case of a dispersion method using three rolls or the like, it was found difficult to have a surfactant, such as a dispersant, uniformly adsorbed on the surface of a solid component powder since the viscosity of the mill base comprising a solid component and an organic vehicle was high. Particularly, those polymeric dispersants which are adsorbed on the functional group of a surface of a solid component powder in a multiple point configuration to prevent aggregation of particles by stearic hindrance-repulsion and electrostatic repulsion between the particles, are mostly viscous liquids at ordinary temperature. It was, therefore, difficult to have them adsorbed uniformly on the surface of the solid component powder. Also, there was the problem that an organic resin component constituting the organic vehicle prevented the dispersant from being adsorbed on the surface of a solid component powder.

There is another method to attain a high dispersion effect by mixing an organic resin component with a dispersant after having it adsorbed on a powder surface. However, it was difficult to obtain a mill base having a viscosity suitable for the three-roll dispersion method or the like, by using a composition composed only of a solid component, a main solvent and a dispersant. Thus, it was unavoidable to add an organic resin component to the mill base before the dispersion treatment, and as the organic resin component prevented the dispersant from being adsorbed, a paste for electroconductive thick film having an excellent dispersibility of a solid component could not be obtained.

If a paste for electroconductive thick film having such undispersed particles of a solid component is used as a paste for screen printing of an internal electrode of a laminated ceramic electronic part, the undispersed particles of the solid component will appear as protruded portions on the dried coated film and penetrate the ceramic layer, thus causing a short circuit defect.

SUMMARY OF THE INVENTION

To overcome the above described problems, preferred embodiments of the present invention provide a method for manufacturing a paste for electroconductive thick film and a paste for electroconductive thick film having little undispersed particles of a solid component in the paste and excellent in dispersibility, even when the solid component of the paste for electroconductive thick film contains a powder having an average primary particle size of 1.0 μm or less, as well as a laminated ceramic electronic part with only a small defective rate due to short circuit.

One preferred embodiment of the present invention provides a method for manufacturing a paste for electroconductive thick film using a solid component, a diluting solvent, a dispersant, an organic resin component and a main solvent, wherein the boiling point of the above-mentioned diluting solvent is lower than that of the above-mentioned main solvent by 100° C. or more, and the above-mentioned diluting solvent is compatible with the above-mentioned organic resin component and the above-mentioned main solvent, the method comprising a first dispersion step for obtaining a first slurry by subjecting a first mill base prepared through mixing the above-mentioned solid component, the above-mentioned diluting solvent and the above-mentioned dispersant to a dispersion treatment, a second dispersion step for obtaining a second slurry by subjecting a second mill base prepared through mixing the above-mentioned first slurry with the above-mentioned organic resin component and the above-mentioned main solvent to a dispersion treatment, and a step for removing the above-mentioned diluting solvent from the above-mentioned second slurry.

The above-mentioned first mill base may further comprise the main solvent.

The above-mentioned first mill base may further comprise the organic resin component, the amount of said organic resin component contained in said first mill base being less than or equal to one-third of the total amount of the organic resin component contained in the paste for electroconductive thick film.

The above-mentioned step for removing the diluting solvent may further comprise an evaporation-removal process using at least either one of the methods of heating and reducing pressure.

The above-mentioned dispersant may be a fatty acid or salt. The fatty acid or salt may be either stearic acid, oleic acid or a metallic salt thereof. The fatty acid may be added to a paste for electroconductive thick film in an amount of about 0.05–5.0 parts by weight.

The above-mentioned dispersant may be an anionic dispersant. The anionic dispersant may be a polymer having a weight average molecular weight of about 5,000 or above. The anionic dispersant may comprise a monomer having at least one group one selected from a carboxylic acid, a sulfonic acid, a phosphoric acid and a neutral salt thereof. The anionic dispersant may be added to the paste for forming a thick film in an amount of about 0.05–10.0 parts by weight.

The above-mentioned solid component may contain at least a metallic powder. The solid component may contain at least a powder having an average primary particle size of about 1.0 $\mu$m or less.

The above-mentioned paste for electroconductive thick film may be a paste for screen printing.

Another preferred embodiment of the present invention provides a paste obtainable by the method of the present invention.

Another preferred embodiment of the present invention provides a laminated ceramic electronic part characterized by an internal electrode formed by using a paste for electroconductive thick film obtainable by the manufacturing method of the present invention.

Other features and advantages of the present invention will become apparent from the following description of the invention which refers to the accompanying drawings.

DESCRIPTION OF PREFERRED EMBODIMENTS

Figure 1:
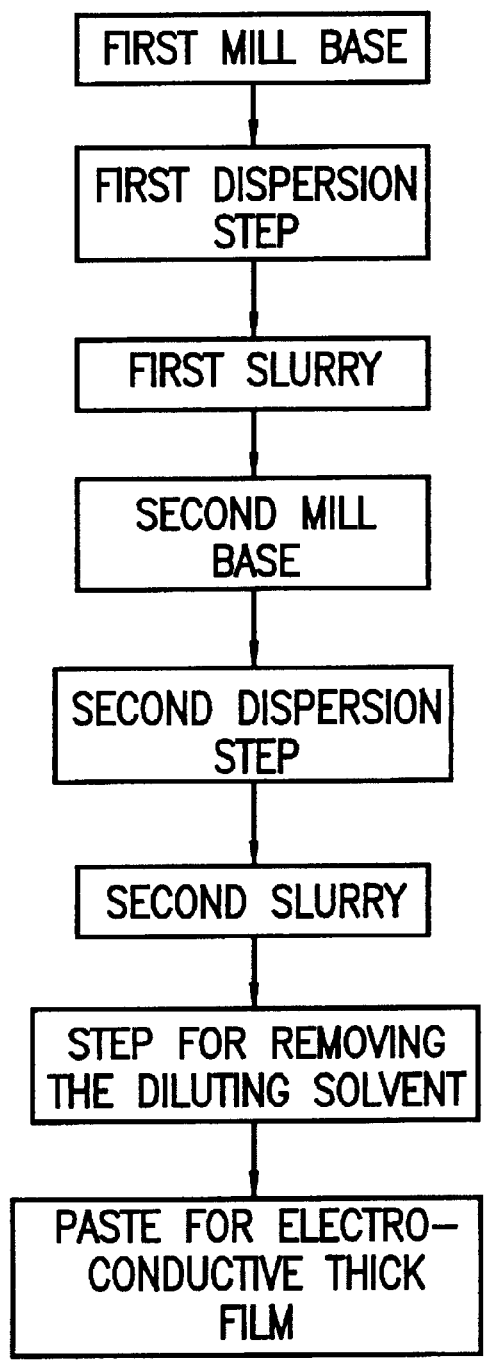
FIG. 1 is a flow diagram showing the steps for manufacturing a paste for electroconductive thick film according to one of the embodiments of the present invention.

The method for manufacturing a paste for electroconductive thick film according to the present invention is characterized by comprising two dispersion steps and a step for removing a diluting solvent, using a solid component, a diluting solvent, a dispersant, an organic resin component and a main solvent. The method for manufacturing a paste for electroconductive thick film according to the present invention is illustrated in FIG. 1.

First, a solid component, a dispersant, a main solvent and a diluting solvent having a boiling point lower than that of the main solvent by about 100° C. or more, are prepared. After the solid component and the dispersant are mixed together, the diluting solvent is added, as appropriate, to obtain a first mill base in a low-viscous state suitable for dispersion. It is then subjected to a dispersion treatment by a dispersion machine to obtain a first slurry. This is called a first dispersion step. Since the first mill base in the first dispersion step does not contain an organic resin component, it can solve both the problem of retarded adsorption of a dispersant due to the high viscosity of a mill base according to the conventional technology, and the problem of an organic resin component preventing adsorption of a dispersant, and enables an effective adsorption of a dispersant on a powder surface. It is noted that the main solvent may be added, as appropriate, to the first mill base. Further, the first mill base may contain the organic resin component in an amount such that both the problem of retarded adsorption of a dispersant due to the high viscosity of a mill base and the problem of an organic resin component preventing adsorption of a dispersant do not occur. That is, the amount of the organic resin component contained in said first mill base may be less than or equal to one-third of the total amount of said organic resin component contained in said paste for electroconductive thick film.

Next, an organic vehicle obtained beforehand by mixing an organic resin component and the main solvent, is added to the first slurry for mixing to prepare a second mill base. When an amount of the organic resin component is contained in the first mill base, an organic vehicle prepared by mixing the remainder of the organic resin component (i.e. without the previous amount) and the main solvent is added to and mixed with the first slurry to thereby obtain a second slurry. It is then subjected to a dispersion treatment by a dispersion machine to obtain the second mill base. This is called a second dispersion step. Though an organic resin component is added to the second mill base, the solid component powder is fully dispersed in the second slurry since the dispersant has been already adsorbed on the surface of the solid component powder. Also, since the dispersant has been adsorbed on the surface of the solid component powder, the solid component powder shows an excellent wettability to the organic resin component. Also, dispersion of the solid component powder in the organic vehicle is accelerated due to the low viscosity of the second mill base itself.

Next, the diluting solvent is removed from the second slurry to obtain a paste for electroconductive thick film. This is called a step for removing the diluting solvent.

As a diluting solvent according to the present invention, is used, as appropriate, a solvent having a boiling point lower than that of the main solvent by about 100° C. or more. For example, a ketone solvent such as acetone or dimethyl ketone, an alcoholic solvent such as methanol or ethanol, or the like is preferable as the diluting solvent, in the case of a paste for electroconductive thick film using a terpene oil as the main solvent, and ethyl cellulose as the organic resin component. If the boiling point of the diluting solvents is not lower than that of the main solvent by about 100° C. or more, an azeotropic distillation of the diluting solvent and the main solvent tends to occur, thus evaporating the main solvent in the course of the removal of the diluting solvent from the second slurry by evaporation. Therefore, the amount of the main solvent in the paste for electroconductive thick film obtained tends to be smaller than intended, with the result that the desirable film thickness cannot be obtained when a coated film is formed using such a paste for electroconductive thick film.

There is no particular limit to the removing method in the step for removing the diluting solvent. For example, heating, reducing pressure, or both can be applied together. Depending on the kind of the diluting solvent added, it is possible to remove the solvent only by heating or reducing pressure. However, it is preferable to employ both of them together in consideration of the productivity.

As a dispersant according to the present invention, an anionic dispersant or a fatty acid type dispersant can be employed as appropriate. A metallic powder such as Ni, Cu, Ag or Pd, or an inorganic oxide powder such as a ceramic generally has a surface indicating a basic property due to a hydroxyl group. Adsorption of an acidic dispersant on the surface of such a basic powder improves the dispersibility of the powder in a paste for electroconductive thick film. An anionic dispersant is referred to as a polymeric type, and a fatty acid type dispersant, as a low-molecular-weight type. In particular, an anionic dispersant improves the dispersibility of a slurry and a paste to a greater extent, since it has a plural number of functional groups in one molecular structure which are related to the adsorption on the surface of the solid component powder to prevent aggregation between the powder particles by forming a three-dimensional adsorption layer on the powder surface. An anionic dispersant is, therefore, preferable as the dispersant.

As an anionic dispersant, for example, polyacrylic acid, a polyacrylate, polymethacrylic acid, a polymethacrylate, maleic acid, maleic anhydride, a phosphate ester-containing resin, a sulfonate ester-containing resin, a polyphenol resin, polyglutamic acid, a polyoxyalkylene, an acid-modified alkyd resin, an acid-modified amide resin, and a copolymer obtained from a combination thereof, having a weight average molecular weight of about 5,000 or above, preferably 10,000 or above, can be employed as appropriate. If the weight average molecular weight is lower than about 5,000, the rate of adsorption onto and desorption from the surface of the solid component powder is increased, resulting in the problem of desorption of a part of the dispersant during the dispersion treatment. It is noted that the anionic dispersant chosen should be compatible with the main solvent and the diluting solvent. Also the anionic dispersant is added to the paste for electroconductive thick film in an amount of about 0.05–10.0 parts by weight. If the amount for addition is less than about 0.05 part by weight, the solid component powder will be aggregated due to insufficient adsorption of the dispersant on the surface of the solid component powder. If the amount is above about 10.0 parts by weight, the adsorption capability of the surface of the solid component powder will be saturated, thus further improvement of dispersibility corresponding to the amount added cannot be expected, and the amount of the nonvolatile organic components contained in the paste for electroconductive thick film will be in excess, so that the removal of the binder at the burning will be insufficient, resulting in defects such as insufficient sintering and delamination. Therefore, it is preferable to measure the amount for addition of the anionic dispersant to saturate the dispersion improvement effect, and then add it in an amount sufficient for the adsorption on the powder surface to be saturated, that is, in a range of about 0.05–10.0 parts by weight.

As a fatty acid type dispersant, for example, stearic acid, oleic acid or a metallic salt thereof can be employed as appropriate. It is noted that the fatty acid type dispersant chosen should be compatible with the main solvent and the diluting solvent. Also the fatty acid type dispersant is added to the paste for electroconductive thick film in an amount of about 0.05–5.0 parts by weight. If the amount for addition is less than about 0.05 part by weight, the solid component powder will be aggregated due to insufficient adsorption of the dispersant on the surface of the solid component powder. If the amount is above about 5.0 parts by weight, the adsorption capability of the surface of the solid component powder will be saturated, thus further improvement of dispersibility corresponding to the amount added cannot be expected, and the amount of the nonvolatile organic components contained in the paste for electroconductive thick film will be in excess, so that the removal of the binder at the burning will be insufficient, resulting in defects such as insufficient sintering and delamination. Therefore, it is preferable to measure the amount for addition of the fatty acid type dispersant to saturate the dispersion improvement effect, and then add it in an amount sufficient for the adsorption on the powder surface to be saturated, that is, in a range of about 0.05–5.0 parts by weight.

Also, the solid component according to the present invention preferably has, as the main component, a metallic powder of Ni, Cu, Ag, Pd or the like, or an alloy powder made from such a metallic powder. Such a metallic powder or an alloy powder acts as an electroconductive component in a paste for electroconductive thick film. Also an inorganic oxide powder such as a ceramic may be added, as appropriate, to the solid component depending on the applications of the paste for electroconductive thick film.

The dispersion effect of the present invention will be demonstrated when the solid component according to the present invention contains at least a powder having an average primary particle size of about 1.0 $\mu$m or less, preferably about 0.5 $\mu$m or less. Even when a powder having an average primary particle size of above about 1.0 $\mu$m is employed, the dispersion effect of the present invention can be obtained. However, a good dispersion of the larger powder can be expected to some extent even by a dispersion method using general three rolls according to the conventional technology since the powder has a small specific surface area.

In a dispersion method practiced in the dispersion steps according to the present invention, a dispersion machine suitable for dispersing a low-viscosity mill base can be employed as appropriate. For example, an impeller-type dispersion machine, a homogenizer type dispersion machine, a pot dispersion machine, a sand mill type dispersion machine, etc. can be enumerated. Though the same dispersion machine is generally employed for the first dispersion step as well as the second dispersion step, different dispersion machines may be employed in consideration of the viscosity of the mill base for dispersion, and the productivity and characteristics of the dispersion machine.

Figure 2:
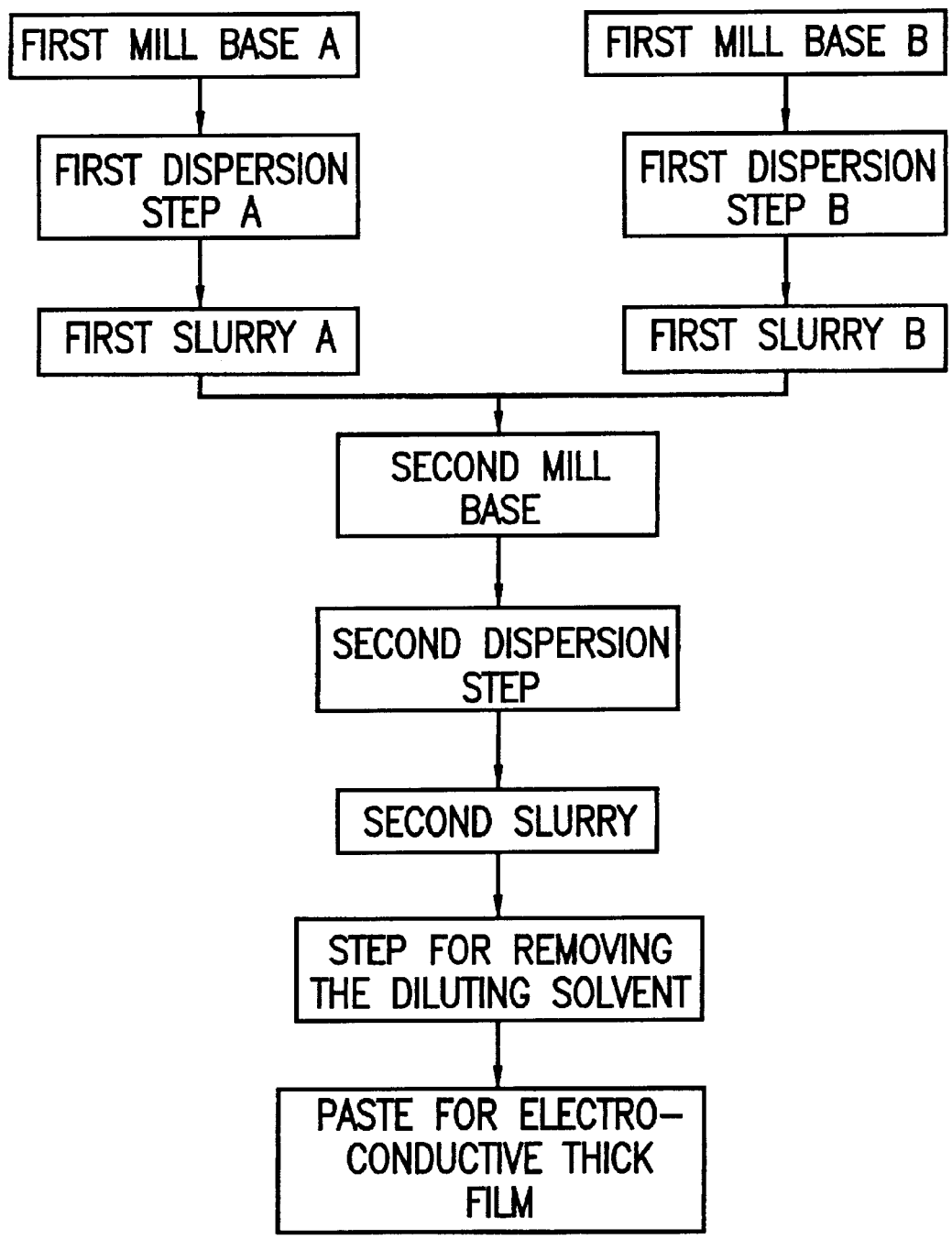
FIG. 2 is a flow diagram showing the steps for manufacturing a paste for electroconductive thick film according to another embodiment of the present invention.
Figure 3:
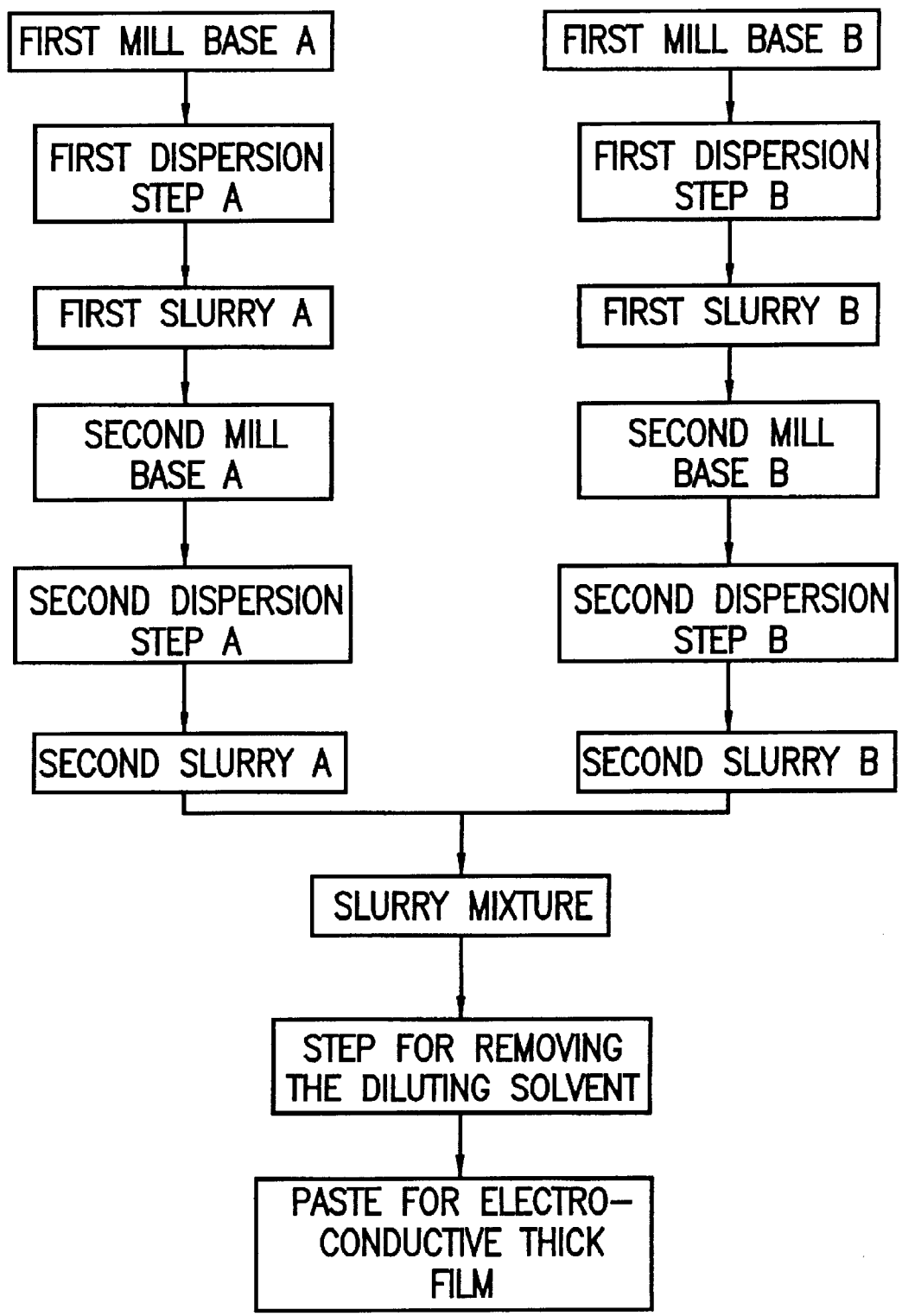
FIG. 3 is a flow diagram showing the steps for manufacturing a paste for electroconductive thick film according to a further different embodiment of the present invention.
Figure 4:
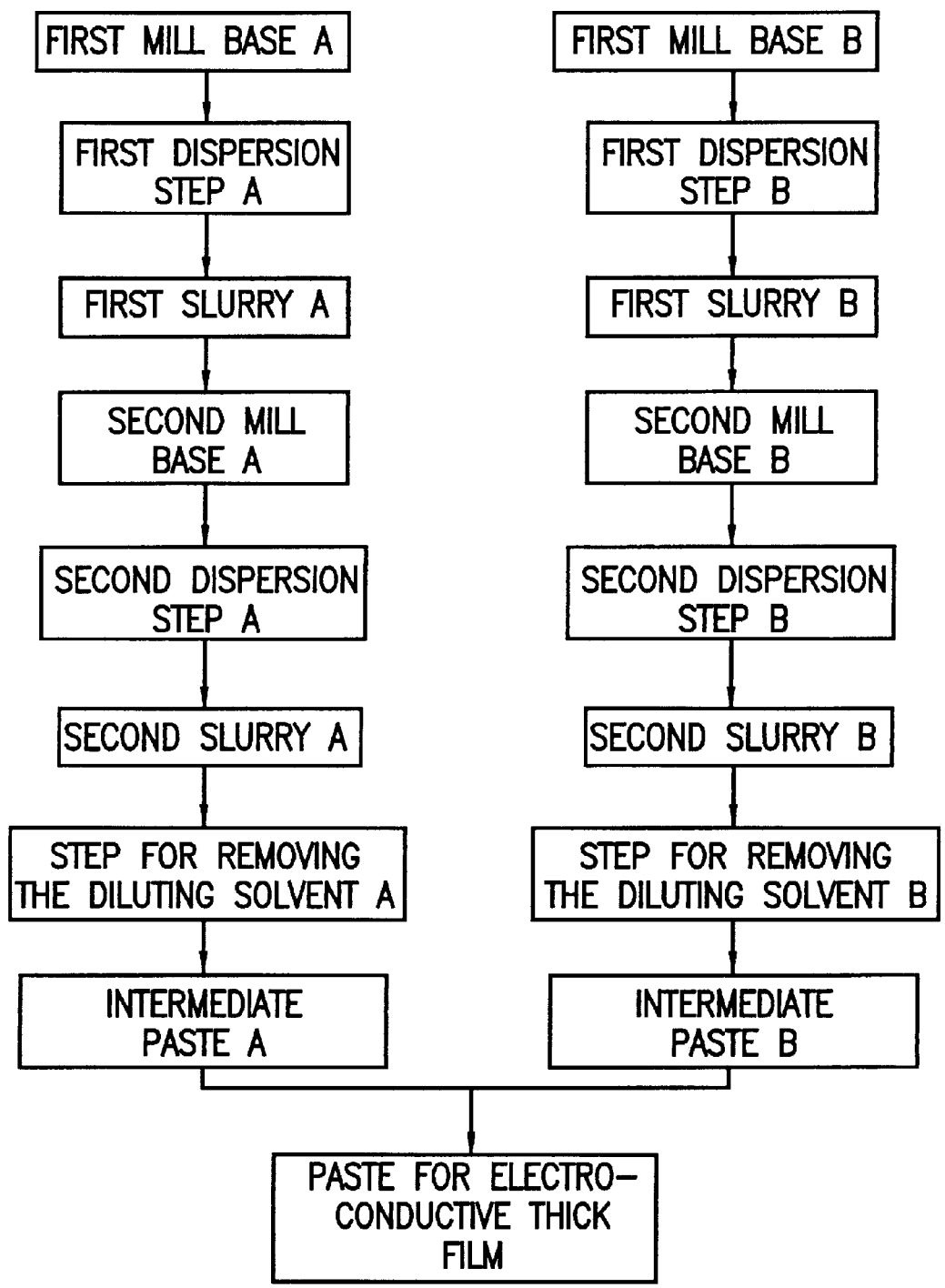
FIG. 4 is a flow diagram showing the steps for manufacturing a paste for electroconductive thick film according to a still further different embodiment of the present invention.

Also, when the best dispersants, the best slurry compositions and the optimum conditions for dispersion are different for each powder in manufacturing a paste for electroconductive thick film in which the solid component comprises a metallic powder, an alloy powder thereof, or the like, and an inorganic oxide powder such as a ceramic, the first slurry or the second slurry may be obtained by mixing a plural number of slurries obtained by the dispersion treatments using, respectively, a dispersant, a slurry composition and dispersion conditions which are best-fit to each powder. It is also permissible to remove the diluting solvents from each of a plural number of second slurries to obtain a plural number of intermediate pastes, followed by mixing them together to obtain a paste for electroconductive thick film having the final desired composition. Thus, as shown in FIG. 2, a first mill base A and a first mill base B may be subjected to a first dispersion treatment respectively to obtain a first slurry A and a first slurry B which are mixed afterward to obtain a second mill base. Also, as shown in FIG. 3, a second slurry A and second slurry B may be mixed to form a slurry mixture, followed by removal of the diluting solvent to obtain a paste for electroconductive thick film. Also, as shown in FIG. 4, the diluting solvent may be removed from a second slurry A and a second slurry B respectively to obtain an intermediate paste A and an intermediate paste B, followed by mixing them together to obtain a paste for electroconductive thick film. Thus a plural number of slurries or pastes may be mixed together, as appropriate, at either the time after a first dispersion step, the time after a second dispersion step and the time after the removal of the diluting solvent. However, the fundamental flow of the method for manufacturing a paste for electroconductive thick film according to the present invention is the same, with a first dispersion step to have a dispersant adsorbed on the solid component in a first mill base having a low viscosity, a second dispersion step to have the first slurry dispersed in a mixture of an organic resin component and a main solvent, and a step to remove the diluting solvent.

EXAMPLES

The following are examples showing the use of a paste for electroconductive thick film according to the present invention as a paste for an internal electrode of a laminated ceramic capacitor as a laminated ceramic electronic part.

As starting materials, a solid component, a diluting solvent, a dispersant, an organic resin component and a main solvent were prepared so that the final paste for electroconductive thick film according to the present invention has a composition shown in Table 1. It is noted that the diluting solvent is not included in the composition of the final paste for electroconductive thick film obtained since it is removed after the dispersion treatments.

electroconductive thick film, by heating it at 45° C. and under a reduced pressure of $2.0 \times 10^{-1}$ atm to remove the diluting solvent.

Next, the method for manufacturing the sample 14 paste for electroconductive thick film will be explained. First, the solid component, the diluting solvent and an organic vehicle obtained beforehand by mixing the organic resin component and the main solvent, were mixed together to obtain a first mill base, and then put into a resin pot having a volume of 1 liter together with balls (2 mm diameter). The dispersion treatment was performed in the pot mill, rotating the pot at a constant rotational speed for 12 hours to obtain a first slurry. Next, the dispersant was added to the above-mentioned pot. The dispersion treatment in the pot mill was performed at a constant rotational speed for another 12 hours to obtain a second slurry. Next, the second slurry was subjected to distillation under a reduced pressure to obtain a paste for electroconductive thick film by heating it at 45° C. and under a reduced pressure of $2.0 \times 10^{-1}$ atm to remove the diluting solvent.

Next, the method for manufacturing the sample 15 paste for electroconductive thick film will be explained. The solid component and an organic vehicle obtained beforehand by mixing the organic resin component and the main solvent

TABLE 1

| Sample | Solid Component | | Diluting Solvent | | Dispersant | | Organic Resin Component | | Main Solvent | | Dispersion Treatment Method |
| | Component | Ratio (parts by weight) | Component | Ratio (parts by weight) | Component | Ratio (parts by weight) | Component | Ratio (parts by weight) | Component | Ratio (parts by weight) | |
| --- | --- | --- | --- | --- | --- | --- | --- | --- | --- | --- | --- |
| 1 | Cu powder Average particle size 0.5 μm | 50.00 | Acetone Boiling point 56° C. | (50.00) | None | 0.00 | Ethyl cellulose | 35.00 | Terpineol Boiling point 210° C. | 15.00 | Pot mill (according to the present invention) |
| 2 | | | | | Stearic Acid | 0.01 | | | | 14.99 | |
| 3 | | | | | | 0.50 | | | | 14.50 | |
| 4 | | | | | | 3.00 | | | | 12.00 | |
| 5 | | | | | | 11.00 | | | | 4.00 | |
| 6 | | | | | Maleic Anhydride-Polystyrene Copolymer Weight Average Molecular Weight 5000 | 0.01 | | | | 14.99 | |
| 7 | | | | | | 0.50 | | | | 14.50 | |
| 8 | | | | | | 3.00 | | | | 12.00 | |
| 9 | | | | | | 11.00 | | | | 4.00 | |
| 10 | | | | | Modified Polyacrylate Weight Average Molecular Weight 10000 | 0.01 | | | | 14.99 | |
| 11 | | | | | | 0.50 | | | | 14.50 | |
| 12 | | | | | | 3.00 | | | | 12.00 | |
| 13 | | | | | | 11.00 | | | | 4.00 | |
| 14 | | | | | | 3.00 | | | | 12.00 | Pot mill (according to the conventional method) |
| 15 | | | | | None | 0.00 | | | | 15.00 | Three rolls |

First, the method for manufacturing the sample 1–13 pastes for electroconductive thick film will be explained. The solid component, the dispersant and the diluting solvent were mixed together to obtain a first mill base, and then put into a resin pot having a volume of 1 liter together with balls (2 mm diameter). The dispersion treatment was performed in the pot mill, rotating the pot at a constant rotational speed for 12 hours to obtain a first slurry. Next, an organic vehicle obtained beforehand by mixing the organic resin component and the main solvent, was added to the above-mentioned pot. The dispersion treatment in the pot mill was performed at a constant rotational speed for another 12 hours to obtain a second slurry. Next, the second slurry was subjected to distillation under a reduced pressure to obtain a paste for were mixed together, agitated in a cake mixer for one hour, and then subjected to a dispersion treatment with three rolls having a diameter of 127 mm to obtain a paste for electroconductive thick film.

Next, the method for manufacturing the samples 16 to 20 pastes for electroconductive thick film will be explained. First, the base composition and the same manufacturing method for sample 12 shown in Table 1 is used except that the predetermined amount of the organic resin component shown in Table 2 is added to and mixed with the first mill base. That is, the amount of the organic resin component contained in the paste for electroconductive thick film is constantly 35.00 parts by weight. For example, in the sample 12 to which 4.00 parts by weight of the organic resin component is added to and mixed with the first mill base, 31.00 parts by weight of the organic resin component is added to and mixed with the first slurry.

TABLE 2

| Sample | Organic resin component contained in first mill base Component | Ratio (Part by weight) | Organic resin component added to first slurry Ratio (Part by weight) | Organic resin component contained in paste for electroconductive thick film Ratio (Part by weight) |
|---|---|---|---|---|
| 16 | Ethyl Cellulose | 4.00 | 31.00 | 35.00 |
| 17 | | 8.00 | 27.00 | |
| 18 | | 11.50 | 23.50 | |
| 19 | | 20.00 | 15.00 | |
| 20 | | 25.00 | 10.00 | |

Next, the sample 1–15 pastes for electroconductive thick film were subjected to a screen printing on a 10 μm thick green sheet of a laminated ceramic capacitor with a coating thickness of 1 μm, are dried in an oven at a specified temperature to obtain a green sheet with a printed electrode. It was then laminated to make 100 layers, pressed, and cut to size to obtain green laminated ceramic capacitor chips. They were burned at a temperature to allow simultaneous burning of the ceramics and the internal electrodes, external electrodes applied on them through baking, in order to manufacture laminated ceramic capacitors. Afterward the defective rate due to short circuit of these laminated ceramic capacitors were examined.

Ten ceramic green sheets of each of the samples 1–20 with printed pastes for electroconductive thick film according to the aforementioned methods were prepared. The numbers of the protruded portions on each electrode surface were examined to determine the average number of protruded portions, and the surface roughness was measured using a needle-type surface roughness gauge. The results are summarized in Table 3. Here, the numbers of the protruded portions were counted for those having a size of 20 μm or above using a metallurgical microscope.

TABLE 3

| Sample | Surface Roughness (μm) | Number of Protruded Portions | Rate of Incidence of Short Circuit Current (%) | Judgment |
|---|---|---|---|---|
| 1 | 3.0 | >50 | 86.0 | x |
| 2 | 3.0 | >50 | 82.0 | x |
| 3 | 2.6 | 4 | 4.0 | ○ |
| 4 | 2.5 | 3 | 2.0 | ○ |
| 5 | 2.5 | 24 | 64.0 | x |
| 6 | 3.0 | >50 | 84.0 | x |
| 7 | 2.4 | 2 | 0.0 | ○ |
| 8 | 2.2 | 0 | 0.0 | ○ |
| 9 | 2.2 | 39 | 74.0 | x |
| 10 | 3.0 | >50 | 80.0 | x |
| 11 | 2.0 | 1 | 0.0 | ○ |
| 12 | 1.9 | 0 | 0.0 | ○ |
| 13 | 1.9 | 38 | 68.0 | x |
| 14 | 3.8 | >50 | 100.0 | x |
| 15 | 2.9 | 20 | 52.0 | x |
| 16 | 1.9 | 0 | 0.0 | ○ |
| 17 | 1.8 | 0 | 0.0 | ○ |
| 18 | 1.9 | 1 | 2.0 | ○ |
| 19 | 6.5 | >50 | 89.0 | x |
| 20 | 9.4 | >50 | 95.0 | x |

○ = excellent
x = poor

As is evident from Table 3, sample 3 in which stearic acid as a fatty acid type dispersant was added in an amount of 0.50 part by weight, sample 4 in which the stearic acid was added in an amount of 3.00 parts by weight, sample 7 in which maleic anhydride-polyethylene copolymer as an anionic dispersant was added in an amount of 0.50 part by weight, sample 8 in which the copolymer was added in an amount of 3.00 parts by weight, sample 11 in which a modified polyacrylate as an anionic dispersant was added in an amount of 0.50 part by weight, and sample 12 in which the polyacrylate was added in an amount of 3.00 parts by weight, were all excellent, having a surface roughness within a permissible range of 1.9–2.6 μm, with only a small average number of protruded portions on the surface of electrode, and showing a low defective rate due to short circuit of 4% or below.

In comparison, all of the samples 1, 2, 5, 6, 9, 10, and 13 in which the amounts of dispersant to be added are either in excess or deficient, were inferior, having a lot of protruded portions on the surface of electrode and with a high defective rate due to short circuit of 64–100%.

Also, both of sample 14 for which a conventional dispersion treatment was performed in a pot mill and sample 15 for which the dispersion treatment was performed in a cake mixer without using a dispersant, had large average numbers of protruded portions, and the rates of incidence of short circuit were as high as 100% and 52% respectively, showing results inferior to those of the samples 3, 4, 7, 8, 11, and 12 in which an appropriate amount of dispersant was employed in a dispersion treatment according to the present invention.

The samples 16, 17 and 18 in which the amounts of the organic resin component added to the first mill base is less than or equal to one-third of the total amount of the organic resin component contained in the paste for electroconductive thick film, were excellent, having a surface roughness within a permissible range of 1.8–1.9 μm, with only a small average number of protruded portions on the surface of electrode, and showing a low defective rate due to short circuit of 0–2%. The results are substantially equal to that of the sample 12 in which the organic resin component is not added to the first mill base.

In comparison, the samples 19 and 20 in which the amounts of the organic resin component added to the first mill base is in excess of one-third of the total amount of the organic resin component contained in the paste for electroconductive thick film, were inferior, having a surface roughness within a range of 6.5–9.4 μm which is not permissible, having a lot of protruded portions on the surface of electrode and with a high defective rate due to short circuit of 85–95%.

The above-mentioned examples are for the cases in which the pastes for electroconductive thick film are pastes for screen printing used for forming an internal electrode of a laminated ceramic capacitor. However, it is noted that the present invention is not limited only to this, and, for example, the same effect may be obtained when applied to various pastes used for forming an electrode of an electronic part such as a laminated ceramic board.

As shown above, the method according to the present invention is a method for manufacturing a paste for electroconductive thick film using a solid component, a diluting solvent, a dispersant, an organic resin component and a main solvent, wherein the boiling point of the diluting solvent is lower than that of the main solvent by about 100° C. or more, and the diluting solvent is compatible with the organic resin component and the main solvent, the method comprising a first dispersion step for obtaining a first slurry by subjecting to a dispersion treatment, a first mill base prepared through mixing the solid component, the diluting solvent and the dispersant, a second dispersion step for obtaining a second slurry by subjecting to a dispersion treatment, a second mill base prepared through mixing the first slurry with the organic resin component and the main solvent, and a step for removing the diluting solvent from the second slurry, in order to obtain a paste for electroconductive thick film having no or few undispersed particles of a solid component in the paste and excellent in dispersibility, even when the solid component of the paste for electroconductive thick film contains a powder having an average primary particle size of about 1.0 $\mu$m or less. Thus, a paste for electroconductive thick film in which the solid component powder is uniformly dispersed due to a sufficient adsorption of a dispersant on the surface of the solid component powder can be obtained, even in the manufacturing of a paste for electroconductive thick film having a relatively high viscosity such as one for screen printing. Also, a coated film obtained by printing a paste for electroconductive thick film according to the present invention on a ceramic green sheet or a ceramic board followed by drying, has an excellent surface smoothness with few undispersed particles of a solid component powder, compared with a coated film formed and dried using a paste for electroconductive thick film manufactured by dispersion with conventional three rolls.

Also, by forming an internal electrode using a paste for electroconductive thick film obtained by the method for manufacturing a paste for electroconductive thick film according to the present invention, a laminated ceramic electronic part with a small defective rate due to short circuits can be obtained even when the paste for electroconductive thick film contains a solid component powder having an average primary particle size of about 1.0 $\mu$m or below.

While the invention has been particularly shown and described with reference to preferred embodiments thereof, it will be understood by those skilled in the art that the forgoing and other changes in form and details may be made therein without departing from the spirit of the invention.

What is claimed is:

1. A method for manufacturing a paste for electroconductive thick film comprising a solid component, a dispersant, an organic resin component and a main solvent, the method comprising:

obtaining a first slurry by mixing and dispersing a first mill base comprising said solid component, said dispersant and a diluting solvent, wherein the boiling point of said diluting solvent is lower than that of said main solvent by about 100° C. or more, and said diluting solvent is compatible with said organic resin component and said main solvent;

obtaining a second slurry by mixing and dispersing a second mill base comprising said first slurry, said organic resin component and said main solvent; and removing said diluting solvent from said second slurry.

2. The method according to claim 1, wherein said first mill base further comprises the main solvent.

3. The method according to claim 2, wherein said first mill base further comprises an amount of said organic resin component which is less than or equal to one-third of the total amount of said organic resin component to be contained in said paste for electroconductive thick film.

4. The method according to claim 1 wherein the step for removing said diluting solvent is an evaporation-removal step by at least either one of heating and reducing pressure.

5. The method according to claim 1 wherein said dispersant is a fatty acid or salt thereof.

6. The method according to claim 5 wherein said fatty acid or salt is stearic acid or oleic acid or a metallic salt thereof.

7. The method according to claim 5 wherein said fatty acid or salt is about 0.05–5.0 parts by weight of said paste for electroconductive thick film.

8. The method according to claim 1 wherein said dispersant is an anionic dispersant.

9. The method according to claim 8 wherein said anionic dispersant is a polymer having a weight average molecular weight of about 5,000 or more.

10. The method according to claim 1 wherein said anionic dispersant comprises a polymerized monomer selected from the group consisting of a carboxylic acid, a sulfonic acid, a phosphoric acid and a neutral salt thereof.

11. The method according to claim 8 wherein said anionic dispersant is about 0.05–10.0 parts by weight of said paste for electroconductive thick film.

12. The method according to claim 1 wherein said solid component comprises a metallic powder.

13. The method according to claim 1 wherein said solid component comprises a powder having an average primary particle size of about 1.0 $\mu$m or less.

14. The method according to claim 13 wherein said solid component is Ni, Cu, Ag, Pd or an alloy thereof, said dispersant is an anionic polymer dispersant having a weight average molecular weight of about 5,000 or more and constitutes about 0.05–10 parts by weight of said paste, said main solvent is a terpene oil and said diluting solvent is a ketone or alcohol.

15. The method according to claim 14 wherein said solid component comprises a powder having an average primary particle size of about 0.05 $\mu$m or less and wherein said anionic polymer dispersant has a weight average molecular weight of 10,000 or more.

16. The method according to claim 1 wherein said paste for electroconductive thick film is adapted for screen printing.

* * * * *